United States Patent [19]

Nakano

[11] 4,423,406

[45] Dec. 27, 1983

[54] NON-CONTACT TYPE POTENTIOMETER

[75] Inventor: Eiji Nakano, Sakuramura Namiki, Japan

[73] Assignees: Agency of Industrial Science and Technology; Ministry of International Trade and Industry, both of Tokyo, Japan

[21] Appl. No.: 353,972

[22] Filed: Mar. 2, 1982

[30] Foreign Application Priority Data

Mar. 31, 1981 [JP] Japan .................................. 56-47592

[51] Int. Cl.³ ............................................ H01L 43/02
[52] U.S. Cl. ................................................ 338/32 R
[58] Field of Search ......................... 338/32 H, 32 R; 324/251, 252; 323/368

[56] References Cited

U.S. PATENT DOCUMENTS

| | | | |
|---|---|---|---|
| 3,671,854 | 6/1972 | Masuda | 323/368 |
| 3,691,502 | 9/1972 | Kataoka | 323/368 X |
| 3,753,202 | 8/1973 | Kataoka et al. | 338/32 H |
| 3,900,814 | 8/1975 | Masuda | 338/32 R |
| 4,125,821 | 11/1978 | Masuda | 323/368 |
| 4,137,512 | 1/1979 | Sidor | 323/368 X |

FOREIGN PATENT DOCUMENTS 47-39631  10/1972  Japan .................................. 323/368

Primary Examiner—C. L. Albritton
Attorney, Agent, or Firm—Schwartz & Weinrieb

[57] ABSTRACT

A non-contact type potentiometer comprises one pair of circular magnetic reluctance elements concentrically disposed and offset by 90° from each other and a semi-circular, rotary, permanent magnet member rotatably disposed and separated from said pair of elements. The two output voltages phase shifted by 90° from each other and produced by the rotation of the rotary member include the regions in which the rotation angle and the output voltage are linearly proportional. By using the signals from these regions, this potentiometer enables the measurement of the rotation angle to be attained throughout the entire cycle of the rotation of the rotary shaft.

18 Claims, 7 Drawing Figures

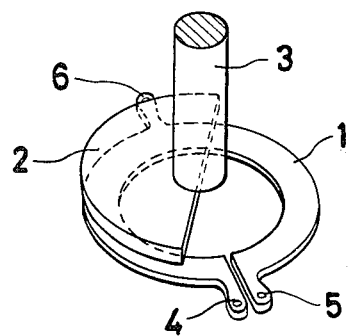
Fig_1
(PRIOR ART)
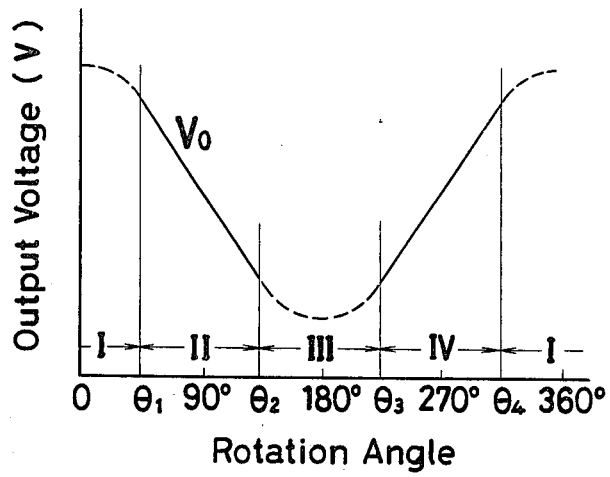
Fig_2
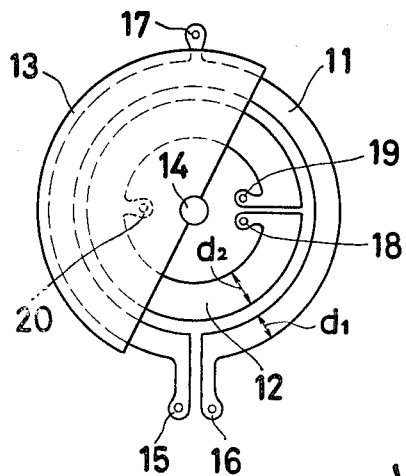
Fig_3
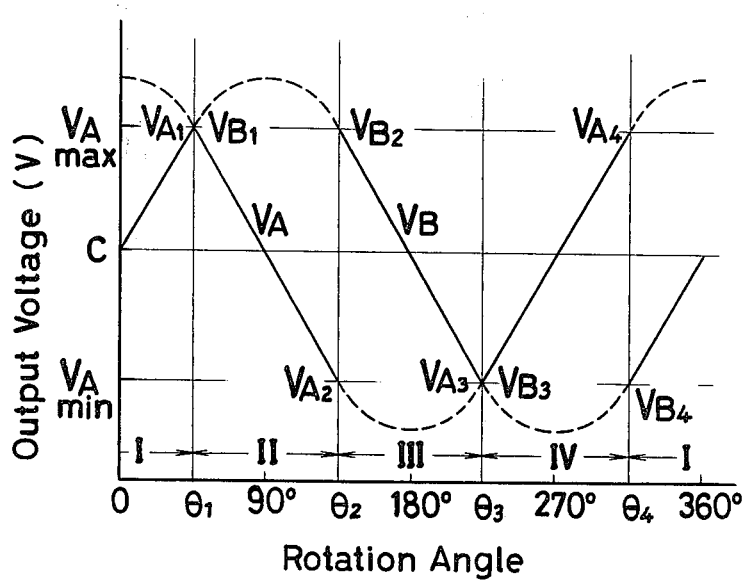
Fig_4

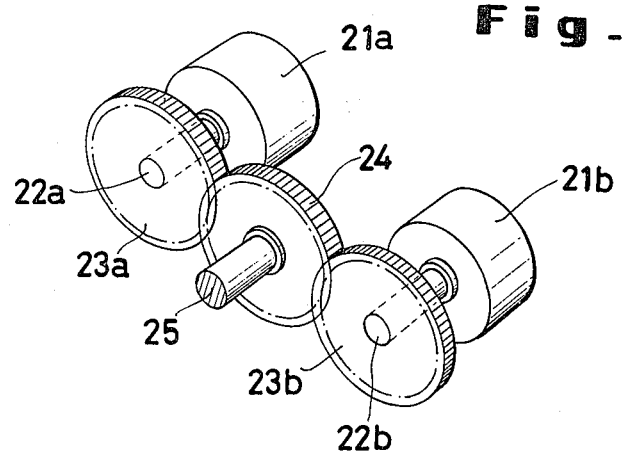

NON-CONTACT TYPE POTENTIOMETER

FIELD OF THE INVENTION

This invention relates to a non-contact type potentiometer.

BACKGROUND OF THE INVENTION

The non-contact type potentiometer which is composed of a magnetic reluctance element and a permanent magnet operates with high reliability and, therefore, is used for the measurement of the angle of rotation of a part designed to produce a continuous rotary motion. The distance traveled by a wheel with a known circumference can be found, therefore, by measuring the angle of rotation of the wheel. The linear distance traveled such as by a sliding part in a machine can be found, therefore, by converting the sliding motion into a rotary motion by means of a rack and pinion and then accurately measuring the angle of rotation.

The major disadvantage suffered by this non-contact type potentiometer resides in the fact that since the measurement can be obtained only in the range of 90 degrees ± 90 degrees, namely 180 degrees, the potentiometer cannot measure the rotation angle of a wheel throughout the entire circle of 360 degrees. Thus, this non-contact type potentiometer cannot be used for the measurement of the amount of continuous motion made by the wheel mentioned above. For measurement of this sort, there is generally used an encoder. Unfortunately, the encoder is heavy and expensive.

OBJECT OF THE INVENTION

An object of this invention is to provide a non-contact type potentiometer which comprises magnetic reluctance elements collectively having an effective range of measurement of 360 degrees and a permanent magnet.

SUMMARY OF THE INVENTION

To accomplish the object described above according to the present invention, there is provided a non-contact type potentiometer which comprises magnetic reluctance elements and a rotary member, providing that the magnetic reluctance elements are relatively disposed so that they will generate two output voltages involving a phase difference of 90 degrees.

As the two output voltages are drawn from the positions separated in phase by 90 degrees as described above, they give rise to sine waves separated by 90 degrees in phase. At an angle where one of the two output voltages is at a non-linear part of its sine wave, therefore, the other output voltage is at a linear part of its sine wave, namely at a part where there is a linear relation between the rotation angle and the output voltage. As a result, the potentiometer of this invention can produce an output voltage corresponding to the linear part of a sine wave throughout 360° of rotation.

BRIEF DESCRIPTION OF THE DRAWING

The other objects and characteristics of the present invention will become apparent from the further disclosure of the invention to be made hereinbelow with reference to the accompanying drawing, wherein:

FIG. 1 is a perspective view of a magnetic reluctance element and a rotary element in the conventional non-contact type potentiometer.

FIG. 2 is a graph showing the characteristic of the output derived from the potentiometer of FIG. 1.

FIG. 3 is a plan view of magnetic reluctance elements and a rotary member of the potentiometer according to the present invention.

FIG. 4 is a graph showing the characteristic of the output derived from the potentiometer of FIG. 3.

FIG. 7 is a perspective view of still another embodiment of the potentiometer according to the present invention.

DESCRIPTION OF ILLUSTRATED EMBODIMENTS

Figure 5:
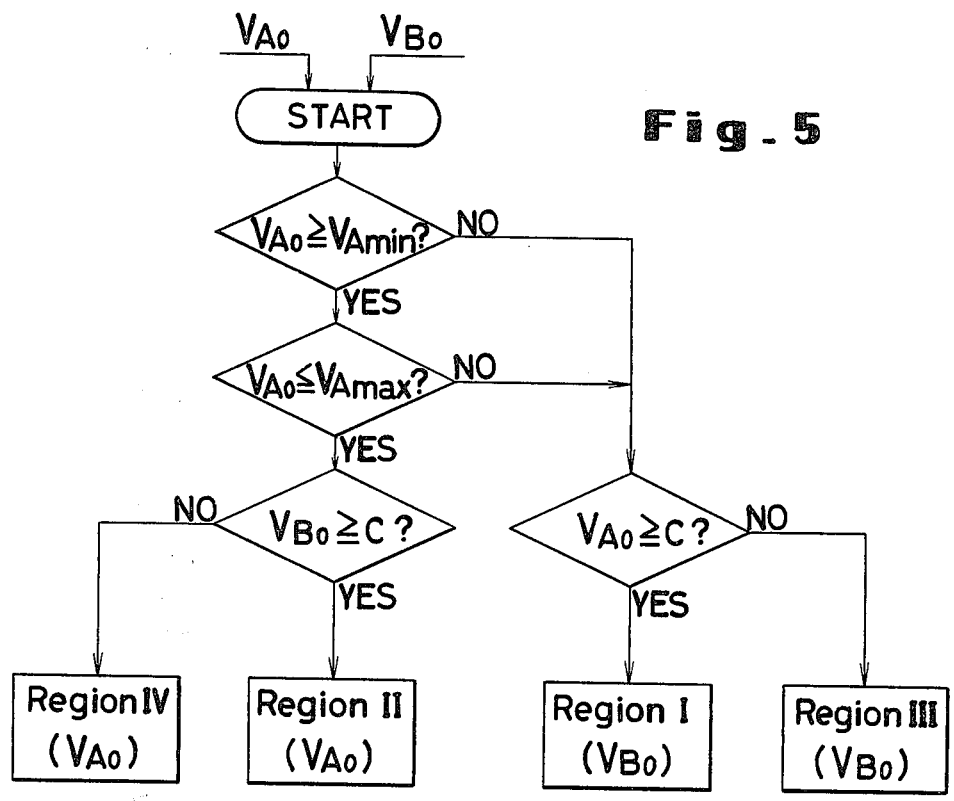
FIG. 5 is a flow chart showing a method for the processing of two output voltage signals.

FIG. 1 represents a typical combination of a magnetic reluctance element and a permanent magnet in the conventional non-contact type potentiometer. Above a circular magnetic reluctance element 1 whose resistance varies with the strength of the magnetic field in which it is placed, a semicircular, rotary, permanent magnet member 2 is disposed concentrically with the aforementioned element 1 but axially separated by a prescribed distance from the element 1, with the rotary member 2 supported by a rotary shaft 3. The magnetic reluctance element 1 is made of a material such as indium antimonide or indium arsenide which varies in resistance with variation in intensity of a magnetic field. At the edges of the element 1 defining a notch inserted therein, terminals 4, 5 adapted to apply a standard voltage are formed. At the position of the element offset by 180° from the notch, the element is provided with an output terminal 6.

In the potentiometer constructed as described above, the rotary member 2 is rotated under application of a standard voltage between the terminals 4, 5 and, on the basis of the characteristics of the output voltage consequently drawn from the terminal 6, the rotation angle of the rotary shaft 3 is detected. The characteristic curve of the output voltage from this potentiometer is illustrated in FIG. 2. It is noted from this diagram that the output voltage describes a sine wave $V_O$ relative to the rotation angle $\theta$. In the four regions I through IV forming one complete cycle of the sine wave, only the regions II, IV contain linear portions of sine wave where a linear relation exists between the rotation angle and the output voltage. This means that the portions of the output voltage which correspond to the two regions II, IV of the sine wave, that is, the portions covering two angles of 90° each, namely a total of 180°, can be measured. This conventional potentiometer, therefore, finds utility only in limited applications.

FIG. 3 illustrates the combination of magnetic reluctance elements and a rotary member in the non-contact type potentiometer according to the present invention. Two annular magnetic reluctance elements 11, 12 having different diameters are concentrically disposed, with their upper surfaces falling flush with each other. A notch is inserted in the magnetic reluctance element 11 having a major diameter to permit the opposed edges thereof to serve as terminals 15, 16 for the application of a standard voltage. At a position offset by 180° from this notch, the element 11 is further provided with a terminal 17 for the delivery of output voltage. Similarly in the magnetic reluctance element 12 of a minor diameter, a notch is inserted to permit the opposed edges thereof to serve as terminals 18, 19 for the application of the aforementioned standard voltage and a terminal 20 for the delivery of output voltage is provided at the position offset by 180° from the notch. The two magnetic reluctance elements are so positioned relative to each other that the output terminals 17, 20 thereof involve a phase difference of 90°. A semi-circular, rotary permanent magnet member 13 is rotatably disposed concentrically with the common center 14 of the pair of magnetic reluctance elements 11, 12 and is separated by a prescribed distance from the two elements.

These magnetic reluctance elements are made of a material such as indium antimonide or indium arsenide which has heretofore been known in the art as varying in resistance in accordance with the intensity of a magnetic field. The rotary member is generally made of a permanent magnet. Although the rotary member is illustrated herein as having a semicircular shape, it may have any other shape insofar as the shape adapted permits the rotary member to apply a magnetic field unevenly to the two elements.

The relation between the output voltage and the rotation angle obtained of the potentiometer of the aforementioned construction of FIG. 3 is shown in the graph of FIG. 4. In the graph, the curve $V_A$ represents the characteristic curve of the output voltage drawn from the terminal 17 of the element 11 and the curve $V_B$ that of the output voltage drawn from the terminal 20 of the element 12. $\theta_1$, $\theta_2$, $\theta_3$, and $\theta_4$ represent the rotation angles at the boundaries of regions I through IV; $\theta_1 \doteq 45°$, $\theta_2 = \theta_1 + 90°$, $\theta_3 = \theta_1 + 180°$, and $\theta_4 = \theta_1 + 270°$, respectively.

It is clear from the graph that the output from the element 12 differs in phase by 90° from the output from the element 11. In the region I, for example, the characteristic curve $V_B$ of the output voltage from the element 12 forms a straight line $V_{B4}$-$V_{B1}$, whereas the characteristic curve $V_A$ of the output voltage from the element 11 forms a curved line $V_{A4}$-$V_{A1}$. In the region II, the characteristic curve of the output voltage from the element 11 forms a straight line $V_{A1}$-$V_{A2}$, whereas the characteristic curve of the output voltage from the element 12 forms a curved line $V_{B1}$-$V_{B2}$.

The entire cycle of one rotation of the rotary member is covered by the effective straight portions of the two output voltages $V_A$, $V_B$ (the portions indicated in solid lines in the diagram) representing a linear relation between the rotation angle and the output voltage. By utilizing these effective straight portions of the two output voltages, therefore, the range of use of this potentiometer can be expanded throughout the entire cycle of the rotation.

Now, the method for determining the rotation angle of the rotary shaft by the values of the output voltages drawn from the two magnetic reluctance elements 11, 12 will be described below.

It is assumed that the rotary shaft of the potentiometer has rotated by a given angle of $\theta$ and the element 11 has consequently given an output voltage $V_{AO}$ and the element 12 an output voltage $V_{BO}$ respectively. In the region II, the amount of travel is measured by utilizing the range of $V_{A1}$ to $V_{A2}$ of the characteristic curve $V_A$. In this region II, the characteristic curve $V_B$ assumes higher values than the characteristic curve $V_A$. In the region IV in which the characteristic curve $V_A$ is utilized, the characteristic curve $V_B$ assumes lower values than the characteristic curve $V_A$. If the output voltage $V_{AO}$ from the magnetic reluctance element 11 falls in the range of solid lines of the characteristic curve $V_A$ of FIG. 4 and the output voltage $V_{BO}$ from the magnetic reluctance element 12 assumes higher values than the output voltage $V_{AO}$, then the output voltage $V_{AO}$ falls within the range of the region II of the rotation angle. Thus, the angle of rotation $\theta_O$ can be found by the calculation based on the output voltage $V_{AO}$ from the magnetic reluctance element 11. If the output voltage $V_{BO}$ from the magnetic reluctance element 12 assumes lower values than the output voltage $V_{AO}$ from the magnetic reluctance element 11 which falls within the range of solid lines, then the output voltage $V_{AO}$ falls within the range of the region IV of rotation angle. Similarly, therefore, the angle of rotation $\theta_O$ can be determined by a calculation based on the output voltage $V_{AO}$.

On the other hand, if the output voltage $V_{AO}$ from the magnetic reluctance element 11 does not fall within the range of solid lines of the characteristic curve $V_A$ of FIG. 4, it can be concluded that the output voltage $V_{AO}$ falls within the range of the region I when it has larger values than those of the output voltage $V_{BO}$ from the magnetic reluctance element 12 or within the range of the region III when it has smaller values. The angle or rotation $\theta_O$, therefore, can be determined by the calculation based on the output voltage $V_{BO}$.

FIG. 5 illustrates the method described above by means of a flow chart. In this flow chart, the maximum value and the minimum value of the characteristic curve $V_A$ in the regions II, IV respectively of the rotation angle are indicated respectively as $V_{Amax}$ and $V_{Amin}$ and the intermediate value of the characteristic curves $V_A$, $V_B$ in the region in use is indicated as C. Thus, the following equations hold good.

$$V_{Amax} = \max(V_{A1}, V_{A4})$$

$$V_{Amin} = \min(V_{A2}, V_{A3})$$

$$C = \tfrac{1}{2} \cdot (V_{A1} + V_{A2}) = \tfrac{1}{2} \cdot (V_{B2} + V_{B3})$$

Of the output voltages $V_{AO}$ and $V_{BO}$, first $V_{AO}$ is compared with $V_{Amin}$. If $V_{AO}$ is greater, then it is compared with $V_{Amax}$. If $V_{AO}$ is smaller, then $V_{BO}$ is compared with C. If $V_{BO}$ is greater, then the output signal $V_{AO}$ forms itself an output signal from the region II. If $V_{BO}$ is smaller than C, then it is seen that the output signal $V_{AO}$ forms itself an output signal from the region IV. If the output signal $V_{AO}$ is smaller than $V_{Amin}$ or greater than $V_{Amax}$, then $V_{AO}$ is compared with C. If $V_{AO}$ is greater, then the output signal $V_{BO}$ forms itself an output signal from the region I. If $V_{AO}$ is smaller, then it is seen that the output signal $V_{BO}$ forms itself an output signal from the region III.

The angle of rotation $\theta_O$ is calculated in accordance with the following equation, based on the output voltage V ($V_{AO}$ or $V_{BO}$) obtained as described above in the linear portions of the sine wave wherein the rotation angle and the output voltage are directly in proportion to each other.

$$\theta_O = aV + b \quad \text{(where } aV + b \leq 360°\text{)}$$

$$\theta_O = aV + b - 360 \quad \text{(where } aV + b > 360°\text{)}$$

Here, the parameters "a", "b" assume the following values, depending on the regions I through IV.

| Region | Parameter a | b |
|---|---|---|
| I | $\dfrac{360° + \theta_1 - \theta_4}{V_{B1} - V_{B4}}$ | $\dfrac{V_{B1}\theta_4 - V_{B4}(360° + \theta_4)}{V_{B1} - V_{B4}}$ |
| II | $\dfrac{\theta_2 - \theta_1}{V_{A2} - V_{A1}}$ | $\dfrac{V_{A2}\theta_1 - V_{A1}\theta_2}{V_{A2} - V_{A1}}$ |
| III | $\dfrac{\theta_3 - \theta_2}{V_{B3} - V_{B2}}$ | $\dfrac{V_{B3}\theta_2 - V_{B2}\theta_3}{V_{B3} - V_{B2}}$ |
| IV | $\dfrac{\theta_4 - \theta_3}{V_{A4} - V_{A3}}$ | $\dfrac{V_{A4}\theta_3 - V_{A3}\theta_4}{V_{A4} - V_{A3}}$ |

The calculation mentioned above is carried out in known arithmetic circuits. Such arithmetic circuits can be advantageously incorporated in the potentiometer.

In the embodiment described above, if the two magnetic reluctance elements 11, 12 are formed of one and the same material, the magnitudes of the output voltages drawn from the output terminals 17, 20 can be substantially equalized with each other by increasing the width $d_2$ of the element 12 over the width $d_1$ of the element 11 to the extent that the areas in which the rotary member 13 applies a magnetic field on the elements 11, 12 will become equal. The equality of magnitude between the two output voltages will prove advantageous for the subsequent processing involved.

Figure 6:
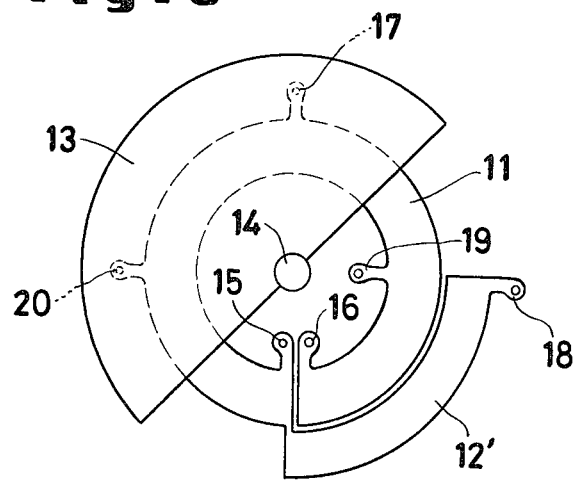
FIG. 6 is a plan view of another embodiment of magnetic reluctance elements in the potentiometer according to the present invention.

FIG. 6 illustrates another embodiment of the potentiometer according to this invention. A magnetic reluctance element 12' of the shape of a truncated quadrant is disposed along only one fourth of the entire circumference of one circle about magnetic reluctance element 11. One edge of the element 12' is connected to one edge of the element 11. A notch is inserted in the element 11 and the opposed edges of the element across this notch form terminals 15, 16 for the application of a standard voltage. At the position offset by 180° from this notch, the element 11 is provided with a terminal 17 for delivering an output voltage. At one edge of the element 12' and at the position of the element 11 corresponding to the edge of the element 12', paired terminals 18, 19 are disposed to permit application of the standard voltage. At the position of the element 11 offset by 180° from the paired terminals, there is disposed a terminal 20 for delivering an output voltage. The portion from the terminal 15 to the terminal 19 of the element 11, therefore, is used commonly by the two elements. A semi-circular, rotary, permanent magnet member 13 magnet is disposed concentrically with the center 14 of the element 11. In the construction described above, when the rotary member 13 is rotated, there are produced two output voltages describing sine waves involving a phase difference 90° as illustrated in FIG. 4 because the output terminals 17, 20 differ in phase by 90° from each other. By treating these output voltages by the same method as used in the first embodiment, the entire cycle of one rotation of the rotary shaft can be covered with the effective linear portion of the output voltages.

The embodiment has been illustrated as having the element 12' of the shape of a truncated quadrant disposed along the circumference of the element 11. Naturally, it is self-evident that the same effects are obtained by having the element 12' disposed along the inner boundary of the element 11. In this case, if the width of the element 12' is made smaller than the width of the element 11 to the extent that the areas in which the rotary member 13 applies a magnetic field on the elements 11, 12' will become equal, the magnitudes of the output voltages drawn from the output terminals 17, 20 are equalized with each other, with the result that the potentiometer in this embodiment functions advantageously. The same effects are also obtained when two circular magnetic reluctance elements are offset in phase by 90° from each other and vertically separated by a proper distance and a semi-circular rotary permanent magnet member is rotatably disposed concentrically between the elements.

FIG. 7 illustrates a further embodiment of this invention, which comprises a pair of non-contact type potentiometers 21a, 21b of such a construction as in FIG. 1 which have rotary members offset in phase by 90° from each other. Rotary shafts 22a, 22b connected respectively to the rotary members 21a, 21b are provided with gears 23a, 23b which engage with a common gear 24 having a shaft 25. Also, in this embodiment, two output voltages separated in phase by 90° as illustrated in FIG. 4 can be obtained from the shaft 25 of the common gear 24, and the respective entire circles of rotation of the pair of potentiometers 21a, 21b can be covered by the effective straight portions of the two output voltages. Further, in this embodiment, friction wheels may be used in place of the gears 23a, 23b, 24.

As described in detail above, the potentiometer of the present invention is constructed so that two output voltages separated in phase by 90° will be drawn therefrom. By the effective linear portions of the two output voltages wherein the output voltage and the rotation angle are proportional to each other, the entire cycle of rotation of the potentiometer can be covered. Consequently, the range of use of the potentiometer can be expanded to 360°. If the rotational rate of the rotary shaft is stored in advance in a counter or some other device, then the potentiometer is enabled to measure accurately the rotation angle from even below 1 mm to infinity. Thus, the potentiometer will suit the measurement of distances of motion of movable parts such as in industrial robots, automatic drafting machines, three-dimentional measuring instruments, and NC machine tools which are operated repeatedly over prolonged periods.

Obviously, many modifications and variations of the present invention are possible in light of the above teachings. It is therefore to be understood that within the scope of the appended claims, the present invention may be practiced otherwise than as specifically described herein.

What is claimed is:
1. A non-contact type potentiometer, comprising:
   a first magnetic reluctance element having first means for accepting the application of a standard voltage thereto, and second means for delivering an output voltage therefrom;
   a second magnetic reluctance element having first means for accepting the application of a standard voltage thereto, and second means for delivering an output voltage therefrom;
   said first and second magnetic reluctance elements being angularly offset with respect to each other by means of 90°; and
   permanent magnet means rotatably disposed relative to, yet separated from, said first and second magnetic reluctance elements for applying a magnetic field to said first and second magnetic reluctance elements.

2. A non-contact type potentiometer as set forth in claim 1, wherein:
said first and second magnetic reluctance elements are annular in configuration.

3. A non-contact type potentiometer as set forth in claim 2, wherein:
said annular elements are concentrically disposed with respect to each other.

4. The potentiometer according to claim 3, wherein the magnetic reluctance element disposed outside and the magnetic reluctance element disposed inside are adapted so that the area of the former element upon which the magnetic field is applied and that of the latter element upon which the magnetic field is applied become equal to each other.

5. The potentiometer according to claim 1, wherein said first and second magnetic reluctance elements are one circular magnetic reluctance element and a magnetic reluctance element of the shape of a truncated quadrant disposed along one quarter of the circumference of said circular magnetic reluctance element and one edge of the element of the shape of a truncated quadrant is connected to one edge of said circular element.

6. A non-contact type potentiometer as set forth in claim 1, wherein:
said first and second magnetic reluctance elements are disposed in co-planar fashion with respect to each other.

7. A non-contact type potentiometer as set forth in claim 6, wherein:
said first and second magnetic reluctance elements have their upper surfaces disposed flush with each other.

8. A non-contact type potentiometer as set forth in claim 1, wherein:
said permanent magnet means has a semi-circular configuration.

9. A non-contact type potentiometer as set forth in claim 4, wherein:
the radial width of said inner reluctance element is greater than the radial width of said outer reluctance element such that the areas of said reluctance elements are equal.

10. A non-contact type potentiometer as set forth in claim 1, wherein:
said permanent magnet means is rotatably disposed concentrically with respect to said reluctance elements.

11. A non-contact type potentiometer as set forth in claim 6, wherein:
said permanent magnet means is disposed above said plane of said co-planar reluctance elements.

12. A non-contact type potentiometer as set forth in claim 1, wherein:
said first and second reluctance elements are axially spaced from each other; and
said permanent magnet means is interposed between said first and second reluctance elements.

13. A non-contact type potentiometer as set forth in claim 5, wherein:
said truncated quadrant magnetic reluctance element is disposed exteriorly of said circular magnetic reluctance element.

14. A non-contact type potentiometer as set forth in claim 5, wherein:
said truncated quadrant magnetic reluctance element is disposed interiorly of said circular magnetic reluctance element.

15. A non-contact type potentiometer as set forth in claim 1, wherein:
said first and second means of each magnetic reluctance element comprise terminals angularly disposed 180° apart from each other.

16. A non-contact type potentiometer as set forth in claim 1, further comprising:
means connected to said second means of each magnetic reluctance element for calculating the amount of rotation as a function of said output voltage signals from said second means of each magnetic reluctance element.

17. A non-contact type potentiometer as set forth in claim 16, wherein:
said calculating means comprises arithmetic circuits.

18. A non-contact type potentiometer as set forth in claim 16, wherein:
said calculating means comprises means for processing those regions of said output voltage signals from said first and second magnetic reluctance elements wherein the rotation angle and said output voltage signals are linearly proportional whereby said potentiometer enables the measurement of the rotation angle to be attained throughout the entire cycle of rotation of 360°.

* * * * *